United States Patent [19]
Delacourt et al.

[11] Patent Number: 5,610,759
[45] Date of Patent: Mar. 11, 1997

[54] COMPACT OPTICAL SOURCE BASED ON THE FREQUENCY DOUBLING OF A LASER

[75] Inventors: Dominique Delacourt, Clamart; Michel Papuchon, Villebon, both of France

[73] Assignee: Thomson-CSF, Paris, France

[21] Appl. No.: 496,318

[22] Filed: Jun. 29, 1995

[30] Foreign Application Priority Data

Jul. 5, 1994 [FR] France .................................. 94 08288

[51] Int. Cl.[6] ...................................................... G02F 1/37
[52] U.S. Cl. ............................................. 359/328; 372/22
[58] Field of Search ..................................... 359/326–332; 372/21, 22

[56] References Cited

U.S. PATENT DOCUMENTS

| 4,879,722 | 11/1989 | Dixon et al. | 372/21 |
| 4,884,277 | 11/1989 | Anton et al. | 372/22 |
| 4,933,947 | 6/1990 | Anthon et al. | 372/21 X |
| 5,038,352 | 8/1991 | Lenth et al. | 372/21 |
| 5,309,454 | 5/1994 | Taira | 372/21 |
| 5,483,374 | 1/1996 | Tanuma | 359/328 |

FOREIGN PATENT DOCUMENTS

| 0314171 | 5/1989 | European Pat. Off. . |
| 0576197A3 | 12/1993 | European Pat. Off. . |

OTHER PUBLICATIONS

Applied Physics Letters, vol. 58, No. 20, "25 ps Pulses from a Nd:YAG Laser Mode Locked by a Frequency Doubling $\Theta$-BA$_2$O$_4$ Crystal", K. A. Stankov, pp. 2203–2204, May 20,1991.

Applied Physics Letters, vol. 62, No. 21, "High Power Blue Light Generation by Frequency Doubling of a Laser Diode in a Periodically Domain–Inverted LiTaO$_3$ Waveguide", Kazuhisa Yamamoto, et al., pp. 2599–2601, May 24, 1993.

*Primary Examiner*—John D. Lee
*Attorney, Agent, or Firm*—Oblon, Spivak, McClelland, Maier & Neustadt, P.C.

[57] ABSTRACT

Disclosed is a compact and coherent optical source using a laser that emits an incident wave at a wavelength $\lambda o_i$, a non-linear medium (NLM) in which the phase matching condition is verified at the wavelength $\lambda o_a$ belonging to the set of $\lambda o_i$ values. This optical source furthermore has two dichroic mirrors M1 and M2 at the points of entry into and exit from the non-linear medium that are highly transparent at the wavelengths $\lambda o_i$ and highly reflective at the wavelengths $\lambda o_i/2$. Such a configuration advantageously enables the locking of the emission of the laser into the wavelength $\lambda o_a$, the recovery of a light wave at $\lambda o_a/2$ and, thus, the amplification of the emitted power at $\lambda o_a/2$. Application to blue sources.

12 Claims, 4 Drawing Sheets

COMPACT OPTICAL SOURCE BASED ON THE FREQUENCY DOUBLING OF A LASER

BACKGROUND OF THE INVENTION

1. Field of the Invention

The field of the invention is that of compact optical sources capable of emitting in the spectral domains, in which emission is not possible for lack of appropriate laser materials or the difficulty of obtaining them, these sources carrying out their emission by operations of frequency conversion.

Indeed, by using the second-order non-linear susceptibility of certain materials such as lithium niobate ($LiNbO_3$), it is possible, with an illumination in the near infrared, to emit in the blue region of the spectrum through the phenomenon of frequency doubling.

In the frequency doubling operation, in order that the optical power transfer done on the basis of the incident illumination at the wavelength $\lambda$ may be efficient, it is necessary, in the material and throughout the interaction, for the non-linear polarization induced by the incident wave to have its phase matched with the wave created at the wavelength $\lambda/2$ which it is sought to feed. However, in general, and because of the dispersal of the refraction indices of the material at $\lambda^\omega$ and $\lambda^{\omega b /2}$, this phase-matching condition is not met straight away.

2. Description of the Prior Art

To circumvent this obstacle, a first approach consists in taking advantage of the birefringence of certain materials in order to compensate for the range of variation of their index. There also exists an alternative approach that consists of the use of quasi-phase matching applicable in conditions that are far more general than those relating to the birefringence of certain materials. This alternative approach consists in periodically disturbing the non-linear interaction in order to compensate for the wave vector difference responsible for the phase mismatching. More precisely, let us take an incident wave being propagated along the axis Ox in the non-linear material and having electrical fields:

$$E\omega = E\omega_{,o} e^{j(\omega t - \beta_\omega x + \phi_{po})}$$

with a wavelength $\lambda\omega = 2\pi c/\omega$ with $\beta_\omega$ being the constant of propagation of the pump wave and $\beta_\omega = 2\pi n_\omega / \lambda_\omega$ c: the velocity of light in vacuum $\omega$: frequency.

In an appropriate material, this wave may give rise to a second-order non-linear polarization written as follows:

$$P_{NL} = \epsilon_o d E_\omega^2 = \epsilon_o d E_{\omega,o}^2 e^{j(2\omega t - 2\beta_\omega x + 2\phi_{po})}$$

where d is the non-linear coefficient brought into play and $\epsilon_o$ is the dielectric permittivity of the vacuum.

This polarization radiates a wave at double frequency liable, as and when the interaction takes place, to set up a harmonic beam with a half wavelength $\lambda^{2\omega} = \lambda^{\omega/2}$ and a propagation constant $\beta_{2\omega}$ with $\beta_{2\omega} = 2\pi n_{2\omega}/\lambda^{2\omega}$ where $n_{2\omega}$ is the refraction index of the material at the wavelength $\lambda^{2\omega}$. The electrical field corresponding to this wave may be written as follows:

$$E_{2\omega} = E_{2\omega,o} e^{j(2\omega t - \beta_{2\omega} x + \phi_{ho})}$$

It can thus be seen that the phase shift $\Delta\phi$ between the non-linear polarization that forms the source of the radiation at $\lambda^{2\omega}$ and the harmonic wave that is to be fed constructively by means of this polarization will play a decisive role in the conversion $\lambda^\omega \to \lambda^{2\omega}$. In fact, this phase shift is expressed at the end of a distance x of interaction as follows:

$$\Delta\phi = (\beta_{2\omega} - 2\beta_\omega)x = \Delta\beta x$$

with $$\Delta\beta = 4\pi(n_{2\omega} - n_\omega)/\lambda^\omega = 4\pi\Delta n/\lambda^\omega$$

It can clearly be seen that, because of the range of variation of the indices, this phase shift is generally not zero.

However, it is possible to create a periodic variation $\Delta\beta = m.K$ or $K = 2\pi/\Lambda$ with $\Lambda$ as the period of the disturbance and $\Lambda = 2L_C$ if $L_C$ is the length of coherence corresponding to the interaction distance at the end of which the polarization and harmonic wave have accumulated a $\pi$ phase shift.

The disturbance may be introduced at any parameter coming into play in the non-linear interaction (refraction index, dispersion of the indices, non-linear coefficient brought into play, etc.).

Through this periodic disturbance, the phase shift $\Delta\phi$ between polarization and harmonic wave is reduced by $\pi$ at the end of each $L_C$, namely instead of continuing to accumulate, it is reduced to zero at each coherence length. In this respect, FIG. 1 illustrates the three possible examples: curve a) phase mismatching, curve b): quasi-phase matching, curve c): perfect phase matching.

The object of the invention relates to a source using a laser emitting an instant wave at $\lambda^\omega$ so as to generate a wave $\lambda^{2\omega}$ by means of a frequency doubler, the frequency doubler being a non-linear medium (NLM) in which the phase matching condition or the quasi-phase matching condition is achieved at the wavelength $\lambda^\omega$.

The source according to the invention enables the problem of the spectral width of emission of the laser to be resolved. This phenomenon is pronounced in the laser diode context whereas the phase matching conditions or quasi-phase matching conditions are met in the medium (NLM) for certain very precise wavelengths only. For this purpose, the compact source according to the invention uses the "locking" of the emission length of the laser by the injection, into this wave, of a signal with a wavelength identical to that for which the phase matching condition or quasi-phase matching condition is ensured.

This notion of "locking", which corresponds to the fact of injecting an optical signal into a laser and notably a laser diode in order to lock the emission wavelength of this diode to the wavelength of the injected signal, has already been dealt with in published work. Thus, the authors of an article (K. Yamamoto, H. Mizuuchi, Y. Kitaoka and M. Kato, "High power blue light generation by frequency doubling of a laser diode in a periodically domain-inserted $LiTaO_3$ waveguide, Appl. Phys. Lett. 62 (21), 24 May 1993) [1] have achieved the continuous variation of the emission wavelength of a monofrequency laser diode by the reinjection, into this diode, of its own beam but after reflection on a dispersive grating (the diode not necessarily having undergone any anti-reflection treatment on the exit face). The schematic diagram of this experiment designed for the frequency doubling of a laser diode by quasi-phase matching (QPM) in a non-linear waveguide is shown in FIG. 2. The rotation of the grating enables the variation of the wavelength reinjected into the laser diode and hence makes it possible to check the wavelength of emission of this diode (in this case around 860 nm) to obtain the desired matching.

The major drawback of this type of technique lies in the fact that the desired matching is not obtained automatically and therefore that an additional feedback is needed so that the system works satisfactorily. In the example referred to here above, the position of the grating has to be servo-linked with the harmonic power emitted in order to follow a potential variation of the QPM wavelength of the doubler, for example under the effect of the external temperature.

The object of the invention is to enable the automatic locking of the wavelength of the laser diode into the wavelength for which the phase matching condition or quasi-phase matching condition is met at the frequency doubler.

For this purpose, the principle of the invention consists of the recycling, in the non-linear component (NLM) used for the frequency doubling, of the major part of the harmonic wave accompanied by a small part of the residual pump wave (the incident wave that generates the non-linear polarization).

It is indeed possible, in the non-linear component, to obtain the amplification of the small part of the recycled pump wave but this is done solely if its wavelength corresponds to that of the phase matching condition or QPM condition in the non-linear component. By reinjecting the optical signal from this amplification, the wavelength of the diode is locked at the exact value that enables the highest efficiency of conversion between the power from the laser diode and the harmonic power that corresponds to the output power of the proposed source.

SUMMARY OF THE INVENTION

To implement this principle, according to the invention there is provided a compact optical source comprising a laser emitting an incident wave in a range of wavelengths $\lambda o_i$ and a non-linear medium (NLM) wherein:

the phase matching condition enabling the cancellation of or compensation for the difference in propagation constant between firstly the non-linear polarization created by the incident wave and, secondly, the harmonic wave generated by this polarization is achieved at the wavelength $\lambda o_a$ belonging to the set of $\lambda o_i$ values, in the medium (NLM);

the optical source also includes two dichroic mirrors $M_1$ and $M_2$ placed in such a way that there is the following succession of elements: the emitter laser, the mirror $M_1$, the medium (NLM), the mirror $M_2$, said mirrors $M_1$ and $M_2$ being highly transparent at the wavelengths $\lambda o_i$ and highly reflective at the wavelengths $\lambda o_i/2$ so as to reinject a wave at $\lambda o_a$ into the laser and recover at $M_1$, a wave at the wavelength $\lambda o_a/2$.

The phase matching condition may be ensured by the birefringence of the medium (NLM) in certain ranges of wavelength, with certain LiNbO$_3$ type non-linear media. When there are conditions of phase matching in the material (NLM), the mirror $M_2$ may advantageously introduce a phase shift $\phi_h$ on the harmonic wave and a phase shift $\phi_p$ on the pump wave such as $2\phi_p - \phi_h = \pm \pi$ to further the parametrical amplification to the detriment of the frequency doubling in the so-called RETURN direction.

For emission wavelengths not compatible with standard birefringent non-linear materials, the quasi-phase matching condition may be ensured by a periodic variation of a physical parameter of the medium (NLM) playing a role in the non-linear interaction between the non-linear polarization created and the harmonic wave. The laser used in the device may advantageously be a laser diode. At least one of the mirrors $M_1$ or $M_2$ may advantageously be integrated into the medium (NLM).

The medium (NLM) may advantageously include a waveguide whose entry and exit faces are treated to make the mirrors $M_1$ and $M_2$.

The medium (NLM) may advantageously be a lithium tantalate (LiTaO3) or lithium niobate (LiNbO$_3$) or potassium and titanyl phosphate (KTP) type of medium.

BRIEF DESCRIPTION OF THE DRAWINGS

The invention will be understood more clearly and other advantages shall appear from the following description and from the appended figures, of which.

Figure 1:
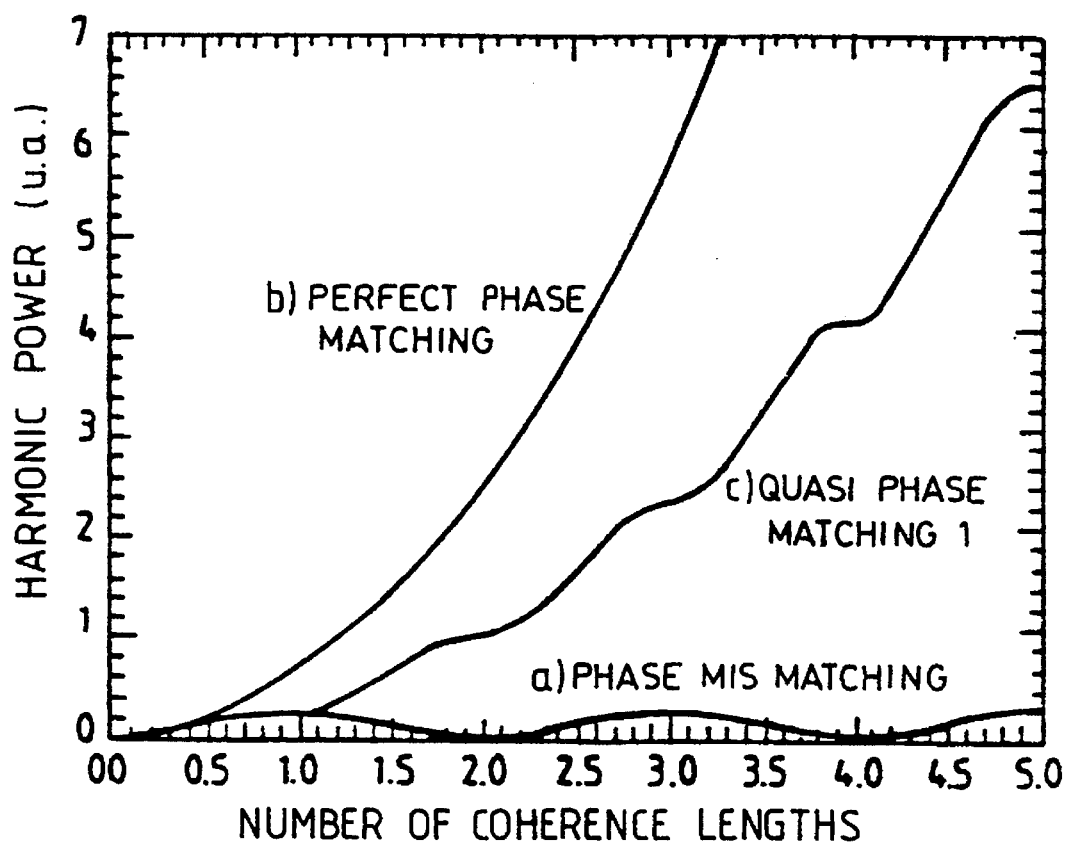
FIG. 1 shows the progress of the harmonic power as a function of the interaction distance in the following cases.
Figure 2:
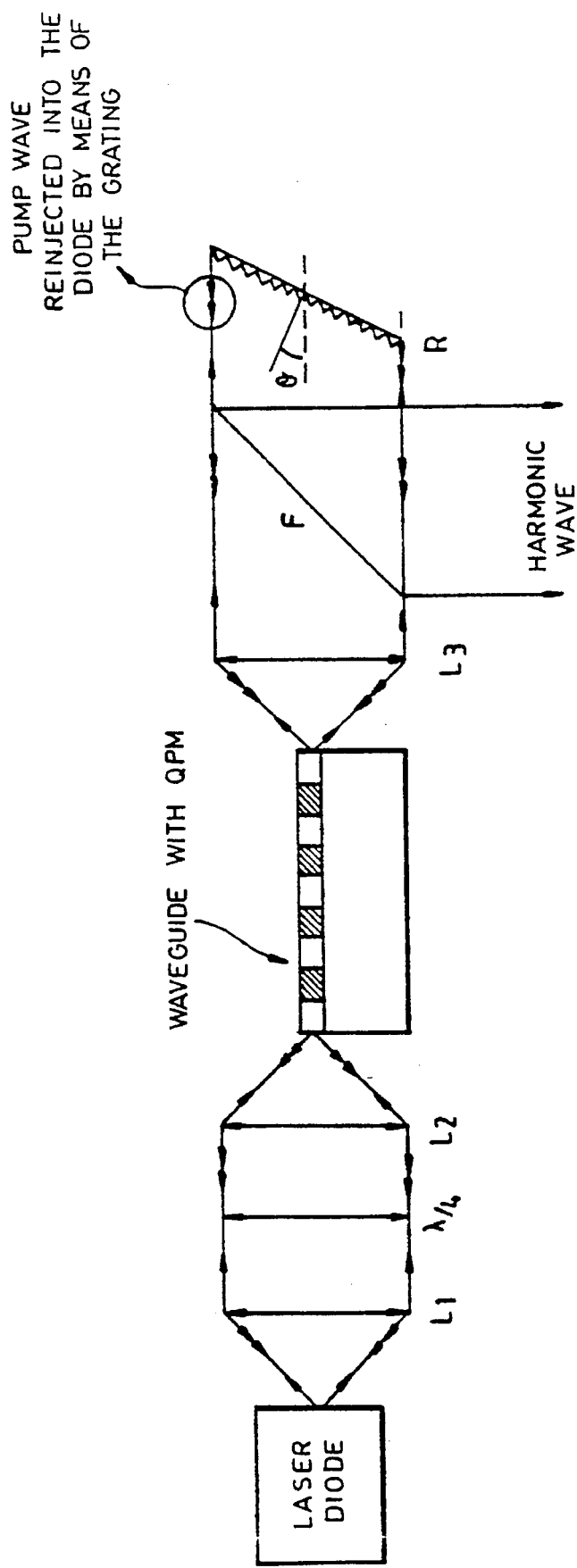
Figure 3:
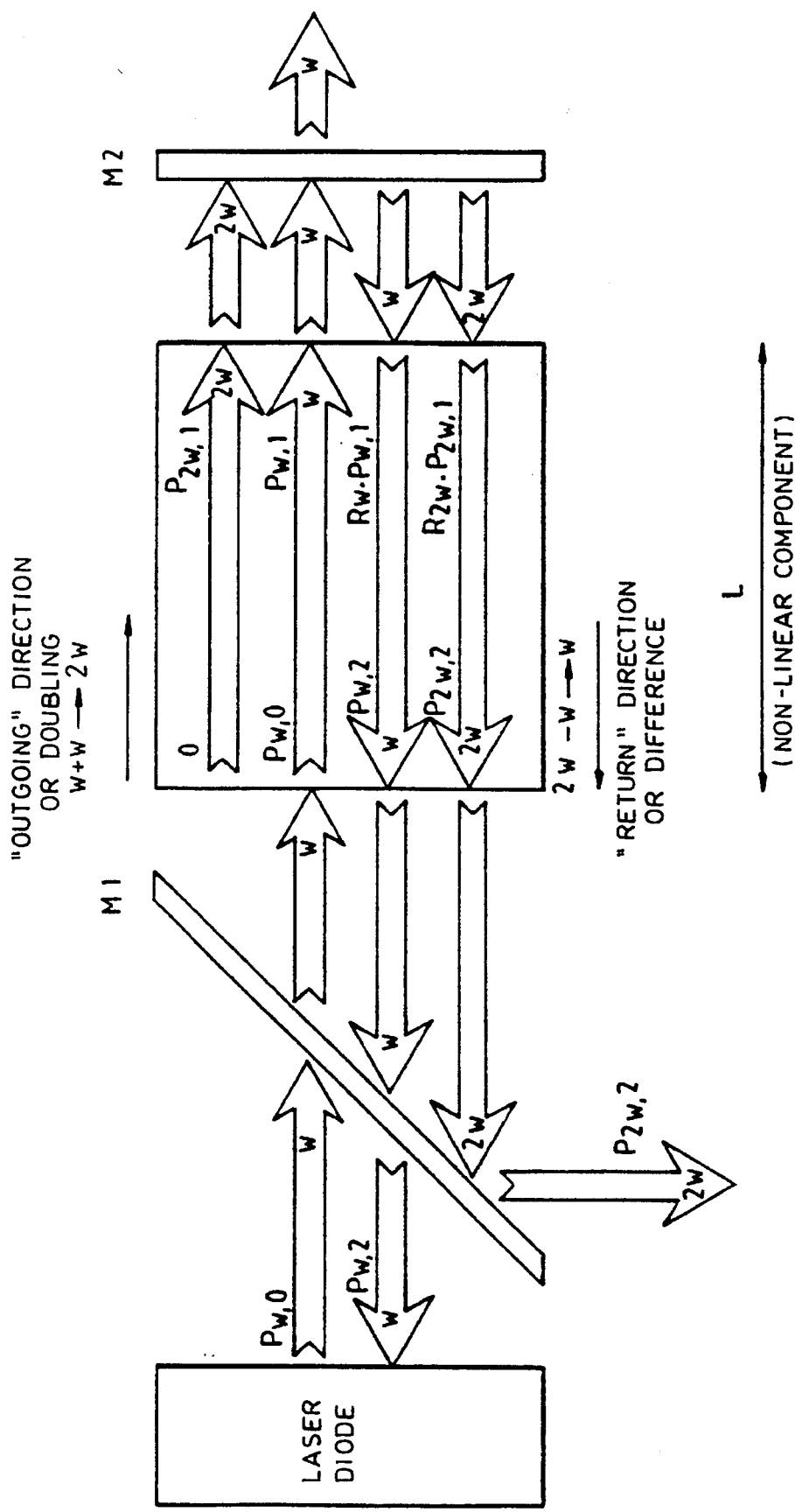
Figure 4A:
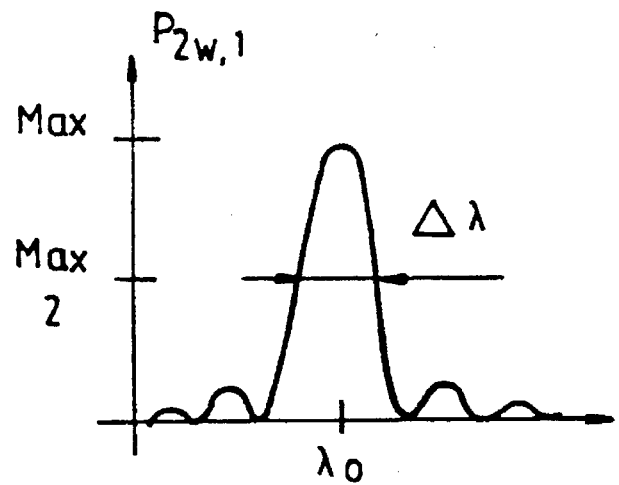
Figure 4B:
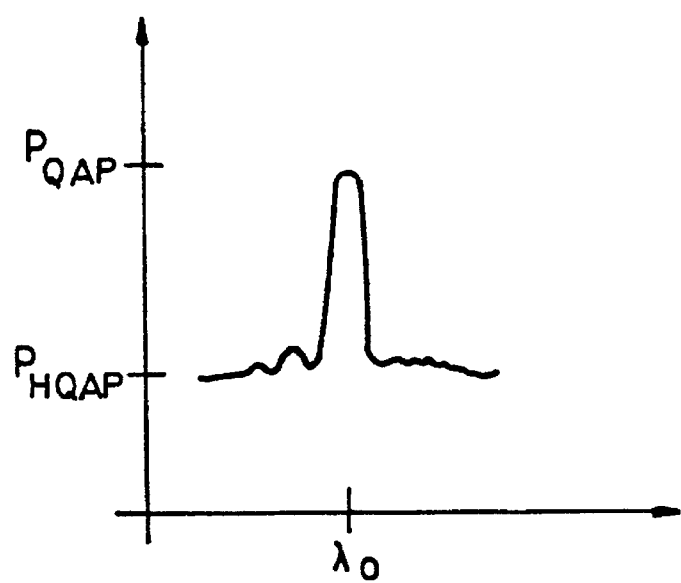

a) phase mismatching b) perfect phase matching c) quasi-phase matching;

FIG. 2 shows a prior art compact source device according to the prior art;

FIG. 3 illustrates a compact source device;

FIGS. 4a and 4b illustrates the spectral progress of the signal at $\lambda^\omega$, as a function of the emission wavelength with FIG. 4a pertaining to the initial light wave and FIG. 4b pertaining to the light wave coming from the medium (NLM) in the "RETURN" direction.

MORE DETAILED DESCRIPTION

One of the possible configurations for making the compact source according to the invention is shown schematically in FIG. 3.

A laser diode (LD) emits a light beam with a power value $P_{\omega,o}$ at the wavelength $\lambda^\omega$. After crossing a dichroic mirror $M_1$ transparent at the wavelength $\lambda^\omega$, the light beam re-enters the non-linear medium (NLM). At exit from the medium the value of power $P_{\omega,o}$ becomes a value of $P_{2\omega,1}$ a part of this beam having been used to create the harmonic wave $P_{2\omega,1}$ at exit from the medium (NLM). A second dichroic mirror $M_2$ highly transparent at the wavelength $\lambda^\omega$ and highly reflective at the wavelength $\lambda^{2\omega}$ is placed at the exit from the medium (NLM) so as to cause the interaction, in a direction called a RETURN direction, of the reflected beam having a power value of $P_{2\omega,1}$ with the small part of the beam at $\lambda^\omega$ that had been reflected by the mirror $M_2$ ($R^{2\omega}$ being the reflection coefficient of $M_2$ at the wavelength $\lambda^\omega$, $R^\omega$ being the reflection coefficient of $M_2$ at the wavelength $\lambda^\omega$).

The configuration illustrated comprises a non-linear medium (NLM) in which the quasi-phase matching condition is met at the wavelength $\lambda^\omega = \lambda_{oa}$ having made a grating structure within said medium.

Thus, in the return direction, it is possible to obtain parametrical amplification of the pump signal in meeting certain conditions as regards the phase shifts introduced by the mirror $M_2$ in the wavelength created at $\lambda^{2\omega}$ and the pump wave at $\lambda^\omega$.

Let $\phi_{po}$ be the pump wave phase $\phi_{ho}$ be the harmonic wave phase during the frequency doubling operation we have $$2\phi_{po} - \phi_{ho} = -\pi/2 \qquad (1)$$

during the operation of parametrical amplification, we have:

$$2\phi_{po} - \phi_{ho} = +\pi/2 \qquad (2)$$

Thus, in the OUTGOING direction, the operation of depleting the pump to the benefit of the creation of photons at the frequency $2\omega$ is done at the expense of the parametrical amplification and the condition (1) is met. To reverse this process and meet the condition (2) in the RETURN direction, it is desirable that the mirror $M_2$ should generate phase shifts $\phi_p$ and $\phi_h$ respectively on the pump wave and the harmonic wave such that $$2\phi_p - \phi_h = \pm \pi \qquad (3)$$

Should the QPM or pump wave and the polarization generated by the pump wave not be in phase at every point of interaction, the equation (3) remains in most cases always valid. However, for very high levels of pump depletion, it should rather be written as $2\phi_p - \phi_h = \phi$ with $\phi$ possibly decreasing up to zero.

The result of the parametrical amplification generated in the "Return" direction is an optical signal whose spectral progress as a function of the emission wavelength of the diode is given in FIG. 4b.

This figure clearly illustrates how the emission of the diode can be locked by the injection therein of a signal that is significant only when the emission wavelength is exactly that for which the phase matching condition or quasi-phase matching condition is met.

At the "Return" exit from the medium (NLM), the wave at $\lambda^\omega$ with a power value of $P_{\omega 2}$ is reinjected into the diode after passing through the dichroic mirror $M_1$, highly transparent at $\lambda^\omega$, while the wave at $\lambda^{2\omega}$ is recovered at said mirror since it is highly reflective at $\lambda^{2\omega}$ with a power value of $P_{2\omega,2}$.

Exemplary application relating to a blue source with a wavelength of 430 nm.

Using a laser diode emitting in the near infrared at 860 nm, namely a GaAs/GaAlAs type diode, it is possible to carry out the frequency doubling operation through a waveguide made on lithium tantalate in which a grating structure has been etched by proton exchange. The reference [1] referred to here above describes such a component where the grating needed to meet the quasi-phase matching condition is obtained by reversing the non-linear coefficient ($d_{33}$) brought into play.

In view of the material and the pump wavelength considered, the period enabling the condition (QPM) is 3.95 µm, the theoretical spectral acceptance being 0.86 angstroms.cm since it is inversely proportional to the interaction length Lc.

The experimental efficiency of the frequency doubling published in reference (1) corresponds to a standardized efficiency $\eta = P_{2\omega}/P_\omega^2 - L^2$. This efficiency is assessed at 230% W.cm$^2$ in not taking account of the depletion of the pump.

By making a mirror $M_2$ of dielectric material with a thickness of about some thousands of angstroms (it may be a layer deposited at the exit from the lithium tantalate) with a reflection coefficient $R^\omega = 0.01$, we obtain, for a pump wave power value of $P^{\omega,0} = 100$ mW on the basis of the standardized conversion efficiency and according to standard computations, the power values $P_{2\omega,1}$; $P_{\omega,2}$; $P_{2\omega,2}$ grouped together in the following table.

| L (cm) | $P_{\omega,1}$ | $P_{2\omega,1}$ | $R_\omega \cdot P_{\omega,1}$ | $P_{\omega,2}$ | $P_{2\omega,2}$ |
|---|---|---|---|---|---|
| 1 | 80,2 | 19,8 | 0,802 | 1,23 | 19,4 |
| 2 | 44,8 | 55,2 | 0,448 | 1,85 | 53,8 |
| 3 | 20,3 | 79,7 | 0,203 | 2,61 | 77,3 |

With KTP crystal, it is possible to achieve efficiency levels $\eta$ close to 80% W.cm$^2$ as indicated by certain authors (D. Eger, M. Oron, M. Katz and A. Zussman, "Very high efficiency of frequency doubling in QPM waveguides of KTP" Paper CHTB1 in Technical Digest of Compact Blue/Green Lasers, Salt Lake City, February 1994). Starting from a power value of $P_{\omega,0} = 100$ mW it is possible to achieve a power value of $P_{\omega,2} \sim 49.5$ mW by means of the device according to the invention.

What is claimed is:

1. A compact optical source comprising a laser device emitting an incident wave in a range of wavelengths $\lambda o_i$ and a non-linear medium (NLM) wherein:

a phase matching condition enabling the cancellation of or compensation for a difference in propagation constant between, firstly, the non-linear polarization created by the incident wave and, secondly, a harmonic wave generated by said polarization, is achieved at the wavelength $\lambda o_a$ belonging to the set of $\lambda o_i$ values, in the medium (NLM);

the optical source also includes two dichroic mirrors $M_1$ and $M_2$ placed in such a way that there is the following succession of elements: the laser device, the mirror $M_1$, the medium (NLM), the mirror $M_2$, said mirrors $M_1$ and $M_2$ being highly transparent at the wavelengths $\lambda o_i$ and highly reflective at the wavelengths $\lambda o_i/2$ so as to reinject a wave at $\lambda o_a$ into the laser and recover, at $M_1$, a wave at the wavelength $\lambda o_a/2$.

2. A compact optical source according to claim 1, wherein the laser emitting an incident wave is a laser diode.

3. A compact optical source according to one of the claims 1 or 2, wherein the mirror M2 introduces a phase shift $\phi_h$ in the harmonic wave and a phase shift $\phi_p$ in a pump wave such that: $2\phi_p - \phi_h = \pm\pi$.

4. A compact optical source according to one of the claims 1 or 2, wherein the phase matching condition in the medium (NLM) is provided by the birefringence of the medium (NLM).

5. A compact optical source according to one of the claims 1 or 2, wherein the phase matching condition is provided by a periodic variation of a physical parameter of the non-linear medium (NLM) playing a role in the non-linear interaction between the non-linear polarization created and the harmonic wave.

6. A compact optical source according to claim 5, wherein the periodically modulated parameter is the non-linear coefficient $d_{33}$.

7. A compact optical source according to one of the claims 1 or 2, wherein the medium (NLM) is a waveguide.

8. A compact optical source according to one of the claims 1 or 2, wherein $\lambda o_a$ is in the region of 430 nm, the laser emitting in the near infrared (towards 830 nm).

9. A compact optical source according to one of the claims 1 or 2, wherein the medium (NLM) is lithium tantalate (LiTaO$_3$).

10. A compact optical source according to one of the claims 1 or 2, wherein the medium (NLM) is potassium titanyl phosphate (KTP).

11. A compact optical source according to one of the claims 1 or 2, wherein the medium (NLM) is lithium niobate (LiNbO$_3$).

12. A compact optical source according to one of the claims 1 or 2, wherein at least one of the two mirrors is integrated into the medium (NLM).

* * * * *